US006420203B1

(12) United States Patent
Okawa et al.

(10) Patent No.: US 6,420,203 B1
(45) Date of Patent: Jul. 16, 2002

(54) METHOD OF PRODUCING SEMICONDUCTOR ELECTRET CONDENSER MICROPHONE

(75) Inventors: Shigeaki Okawa, Tochigi; Toshiyuki Ohkoda, Gunma; Yoshiaki Ohbayashi, Nara; Mamoru Yasuda, Osaka; Shinichi Saeki, Osaka; Shuji Osawa, Osaka, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/032,632

(22) Filed: Dec. 28, 2001

Related U.S. Application Data

(62) Division of application No. 09/660,061, filed on Sep. 12, 2000.

(30) Foreign Application Priority Data

Sep. 16, 1999 (JP) .......................................... 11-261374

(51) Int. Cl.[7] ................................................ H01L 21/00

(52) U.S. Cl. ............................ 438/53; 438/50; 257/419

(58) Field of Search ..................... 438/50, 53; 257/415, 257/419, 416; 381/193, 202, 335, 342, 398, 399, 423, 355, 361

(56) References Cited

U.S. PATENT DOCUMENTS 5,272,758 A * 12/1993 Isogami et al. ............. 381/191

FOREIGN PATENT DOCUMENTS

JP Hei. 11-88992 3/1999

* cited by examiner

*Primary Examiner*—David Nelms
*Assistant Examiner*—Andy Huynh
(74) *Attorney, Agent, or Firm*—Fish & Richardson, P.C.

(57) ABSTRACT

A stationary electrode layer 12 is formed on a semiconductor substrate 11, and a vibrating diaphragm 16 is disposed on spacers 14. The vibrating diaphragm 16 is placed so as to protrude from an end of the semiconductor substrate 11, and terminal pads 20 to 23 are placed with being exposed from the vibrating diaphragm 16.

2 Claims, 4 Drawing Sheets

METHOD OF PRODUCING SEMICONDUCTOR ELECTRET CONDENSER MICROPHONE

This is a divisional of application Ser. No. 09/660,061, filed Sep. 12, 2000, which in turn claims the benefit of Japanese application No. Hei. 11-261374, filed Sep. 16, 1999.

BACKGROUND OF THE INVENTION

The present invention relates to a semiconductor device and a semiconductor electret condenser microphone.

In a portable telephone, an electret condenser microphone which can be easily miniaturized is frequently used. For example, Japanese Patent Publication No. Hei. 11-88992 discloses an example in which a conductive film (hereinafter, referred to as a stationary electrode layer) is formed on an integrated semiconductor substrate, and a vibrating diaphragm is attached onto the stationary electrode layer via a spacer.

FIG. 3 shows the structure of the example. A stationary electrode layer 112, an insulating film 113, a spacer 114, and a vibrating diaphragm 115 are sequentially stacked on the surface of a silicon semiconductor substrate 111. The stacked member is mounted into a package 118 having a through hole 116. The reference numeral 117 denotes cloth which is disposed as required. A junction type FET element for impedance conversion, an amplifying circuit, a noise-canceling circuit, and the like are integrated on the surface of the semiconductor substrate 111 by a usual semiconductor process. In a capacitor formed by the vibrating diaphragm 115 and the stationary electrode layer 112, air vibrations due to a sound cause the vibrating diaphragm 115 to vibrate to change the capacitance, and the capacitance change is input into the FET element to be converted into an electric signal.

In this configuration, in order to enhance the output of the microphone, the capacitance must be increased. It is a matter of course that, preferably, the stationary electrode layer 112 and the vibrating diaphragm 115 are expanded as far as possible so as to increase the overlapping area, and the distance between the stationary electrode layer 112 and the vibrating diaphragm 115 is reduced. In the semiconductor substrate 111, therefore, the stationary electrode layer 112 occupies most area of the substrate, and components to be integrated are placed in the blank area.

When, in order to enhance the output of the microphone, the area of the stationary electrode layer 112 is to be expanded so as to increase the overlapping area between the stationary electrode layer 112 and the vibrating diaphragm 115, however, it is required to increase the size of the semiconductor substrate itself, thereby producing a defect that the production cost is raised.

In order to suppress the production cost, the stationary electrode layer 112 and the vibrating diaphragm 115 may be increased in size while maintaining the current size of the semiconductor substrate. In this case, however, there arises a problem in that the vibrating diaphragm 115 overlaps with terminal pads formed in a periphery of said semiconductor substrate, resulting in a structure in which thin metal wires cannot be connected to the pads.

Referring to FIG. 3, the spacer 114 is placed in the entire surrounding region of the vibrating diaphragm 115, and hence the space defined by the stationary electrode layer 112, the spacer 114, and the vibrating diaphragm 115 is hermetically sealed. Therefore, air cannot enter nor exit from the sealed space, so that the vibrating diaphragm 115 itself hardly vibrates. Even when external sound is transmitted to the vibrating diaphragm, consequently, the vibrating diaphragm vibrates at a small degree, thereby producing a problem in that the output cannot be enhanced.

SUMMARY OF THE INVENTION

The invention has been conducted in view of the above-discussed problems. The problems can be solved by a configuration in which a vibrating diaphragm is disposed with protruding a part of the vibrating diaphragm from an end of a semiconductor substrate.

When the vibrating diaphragm protrudes from the periphery of the semiconductor substrate, air vibrations are reflected by the rear face of the protruding vibrating diaphragm, and then easily enter a space defined by the vibrating diaphragm and a stationary electrode layer, with the result that the vibrating diaphragm is allowed to vibrate at a larger degree.

The problems can be solved by a configuration in which a vibrating diaphragm is disposed with protruding a part of the vibrating diaphragm from an end of a semiconductor substrate, and a terminal pad for external connection is exposed, the terminal pad being formed in a periphery of the semiconductor substrate.

The vibrating diaphragm is shifted so as not to overlap with the terminal pad. Even when the vibrating diaphragm protrudes from the semiconductor substrate, therefore, air vibrations are reflected by the rear face of the protruding vibrating diaphragm, and then easily enter a space defined by the vibrating diaphragm and a stationary electrode layer, with the result that the vibrating diaphragm is allowed to vibrate at a larger degree. Since the vibrating diaphragm does not overlap with the terminal pad, moreover, connection of a thin metal wire is enabled.

The problems can be solved by a configuration in which the spacer is discontinuous and is divided.

When the spacer is divided, air can enter and exit from a space defined by the vibrating diaphragm, the spacer, and the stationary electrode layer, through division regions of the spacer. Namely, since air can enter and exit from the space, the vibrating diaphragm can vertically move in an easy manner or vibration is facilitated.

The problems can be solved by a configuration in which an insulating film is formed on a semiconductor wafer, stationary electrode layers are formed on the insulating film in a matrix form, a spacer configured by an insulating resin film is formed in a periphery of the stationary electrode layers, the semiconductor wafer is then subjected to dicing, thereby forming a semiconductor device, and a vibrating diaphragm is disposed on the spacer of the semiconductor device.

After the semiconductor wafer is subjected to dicing, the vibrating diaphragm is disposed on the spacer. Therefore, both the shifting and the protrusion of the vibrating diaphragm can be performed.

In a semiconductor electret condenser microphone in which a semiconductor device comprising: a stationary electrode layer which is formed on a surface of a semiconductor substrate; at least two spacers disposed in a periphery of the stationary electrode layer; and a vibrating diaphragm disposed on the spacers is mounted in a hollow package, a side face of the semiconductor substrate is separated from the package, and a space due to the separation communicates with a space below the vibrating diaphragm via gaps between the spacers. Therefore, the air below the vibrating diaphragm can exit into the space due to the separation, and conversely the air in the space due to the separation can enter the space below the vibrating diaphragm, whereby the vibrating diaphragm is allowed to easily vibrate.

DETAILED DESCRIPTION OF THE PREFERRED EMBODIMENT

Hereinafter, an embodiment of the invention will be described in detail with reference to the accompanying drawings.

Figure 1:
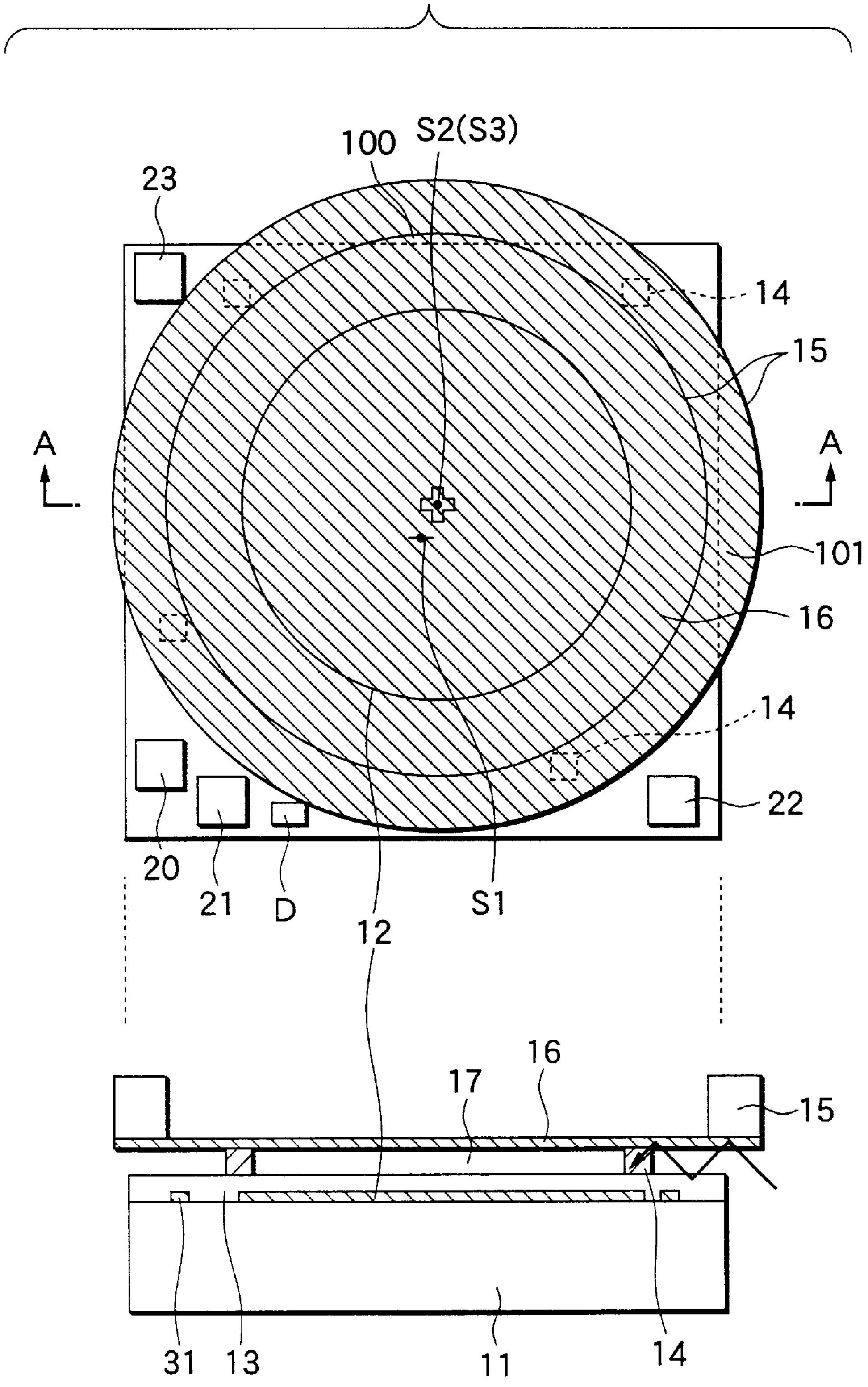
FIG. 1 is a view illustrating the semiconductor device of the invention.

In FIG. 1, the upper portion is a plan view showing a semiconductor device of the invention, and the lower portion is a section view taken along the line A—A. A circular stationary electrode layer 12 of a diameter of about 1.5 mm is formed on the surface of a semiconductor substrate 11 having a size of about 2×2 mm. A junction or MOS type FET element D for impedance conversion, bipolar or MOS type active elements, passive elements such as resistors are integrated on the surface of the semiconductor substrate 11 by a usual semiconductor process to constitute an integrated circuit network including the conversion element D, an amplifying circuit, and a noise-canceling circuit. Terminal pads 20 to 23 for enabling input and output operations between the integrated circuits and external circuits are arranged in the periphery of the semiconductor substrate 11.

Figure 4:
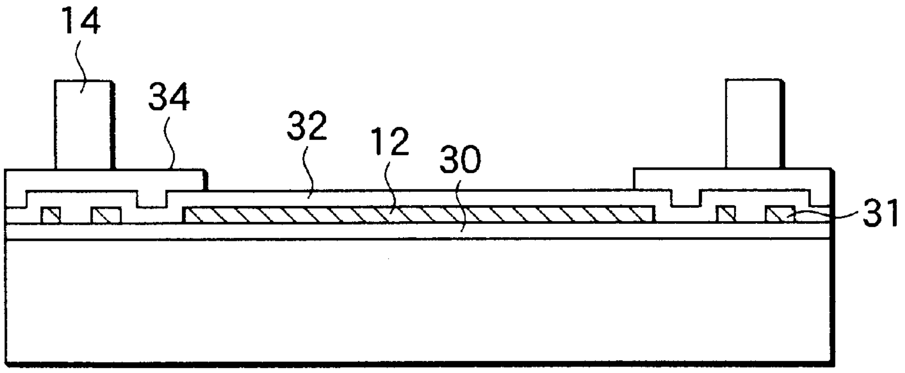
FIG. 4 is a view illustrating the semiconductor device of the invention.

In the lower portion of FIG. 1, an insulating film 13 is formed on the stationary electrode layer 12, and spacers 14 are placed on the insulating film. FIG. 4 specifically shows this configuration.

Referring to FIG. 4, the configuration will be described. The reference numeral 30 denotes an $SiO_2$ film of 5,000 to 10,000 angstroms which is positioned below first layer wirings 31. The stationary electrode layer 12 is formed simultaneously with the wirings 31 of first layer, and made of, for example, Al—Si. An $Si_3N_4$ 32 film of about 4,000 angstroms is formed on the stationary electrode layer. As required, a passivation film 34 such as a PIX film or an $Si_3N_4$ film is formed. The passivation film 34 is removed away from the almost entire region of the stationary electrode layer 12 because the passivation film increases the thickness of a dielectric material constituting a capacitance.

Returning to FIG. 1, as described above, the insulating film 13 is formed on the whole face of the semiconductor substrate 11, and the spacers 14 are formed on the insulating film 13.

The spacers 14 are made of a photosensitive resin such as polyimide, and patterned by the photolithography technique. In the embodiment, the spacers have a thickness of about 13 $\mu$m after a baking process.

The production of the configuration described above is performed on a semiconductor wafer. Thereafter, the wafer is divided into individual semiconductor devices by dicing.

Hereinafter, the reason why dicing is performed after the spacers 14 are formed on the semiconductor wafer will be described. The stationary electrode layer 12 of a size which is as large as possible is placed in close proximity to the terminal pads 20 to 23, and a vibrating diaphragm 16 is placed on the layer. The vibrating diaphragm 16 is larger in size than the stationary electrode layer 12. Therefore, the vibrating diaphragm 16 overlaps with the terminal pads 20 to 23, and thin metal wires which are not shown cannot be connected to the pads. Consequently, the vibrating diaphragm 16 which is essential in the invention is shifted so as to expose the terminal pads. As a result, the vibrating diaphragm 16 inevitably protrudes from the semiconductor substrate 11.

If the vibrating diaphragm 16 is attached in a state of a wafer and then dicing is performed, also the vibrating diaphragm 16 is subjected to dicing together with the wafer. In this case, therefore, the vibrating diaphragm 16 cannot protrude from the semiconductor substrate 11.

When the vibrating diaphragm 16 protrudes from the semiconductor substrate 11, air vibrations can easily enter a space defined by the vibrating diaphragm 16 and the semiconductor substrate 11 while being reflected by the rear face of the protruding vibrating diaphragm 16, with the result that the vibrating diaphragm 16 can easily vibrate.

For example, the vibrating diaphragm is a polymer film which has a thickness of about 5 to 12.5 $\mu$m and on one face of which an electrode material such as Ni, Al, or Ti is formed. The vibrating diaphragm is made of, for example, a polymer material such as FEP or PFA. Of course, it is preferable to form an electret film in both the cases of the structure of the conventional art and that of the invention. The diameter of the vibrating diaphragm 16 is larger than or about 1.2 to about 1.5 times that of the stationary electrode layer 12.

In the same manner as the structure of the conventional art, the device is mounted in a package, and the terminal pads 20 to 23 are electrically connected to terminals formed in the package, via thin metal wires. Of course, the terminals in the package are elongated to the outside of the package so as to be fixable to terminals on a mounting circuit board. A through hole is opened in the upper face of the package, and cloth is bonded thereto as required.

The reference numeral 21 denotes Vcc, 22 denotes GND, 20 denotes an output terminal, and 23 denotes an input terminal.

The invention has especially two features. The first one is that the vibrating diaphragm 16 protrudes from the semiconductor substrate 11.

The second one is that the placement of the vibrating diaphragm 16 is improved so as to expose the terminal pads 20 to 23.

The former or first feature is realized by the configuration in which, as indicated by the arrow in the lower portion of FIG. 1, vibrations are transmitted into a space 17 defined by the vibrating diaphragm 16 and the semiconductor substrate 11, through the rear face of the vibrating diaphragm 16. As a result, the vibrating diaphragm 16 is enabled to vibrate at a larger degree.

The latter or second feature is performed because of the following reasons. The terminal pads 20 to 23 are wire bonded to the terminals in the package, and the vibrating diaphragm 16 is then placed on the spacers 14 at a height of about 13 $\mu$m. Namely, the vibrating diaphragm 16 is prevented from abutting against the thin metal wires.

In the configuration in which the vibrating diaphragm 16 protrudes form the semiconductor substrate 11, moreover, the terminal pads can be exposed as shown in FIG. 1, and hence it is not required to increase the size of the semiconductor substrate 11.

Figure 2:
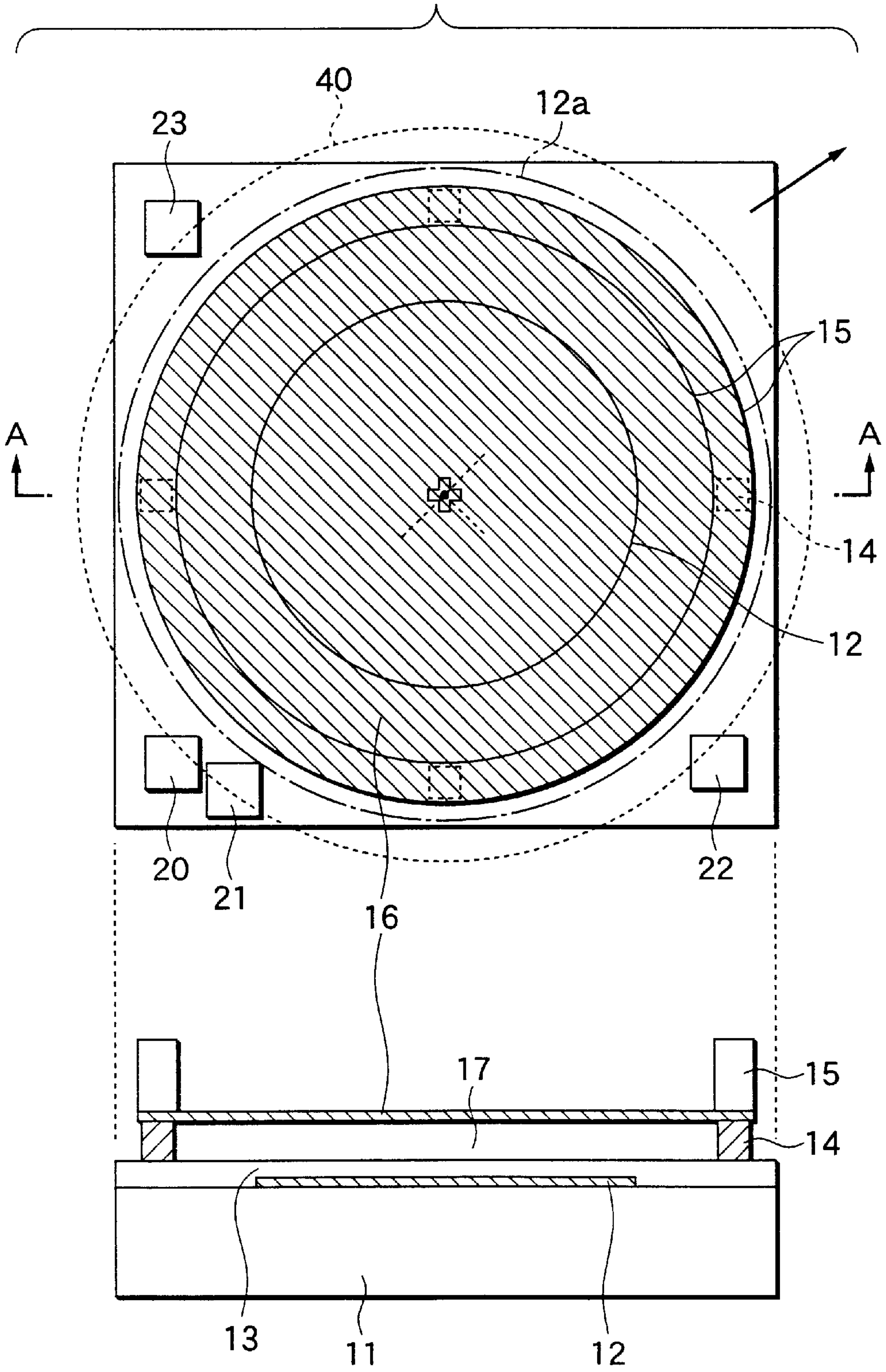
FIG. 2 is a view of the semiconductor device and illustrating the summary of the invention.
Figure 3:
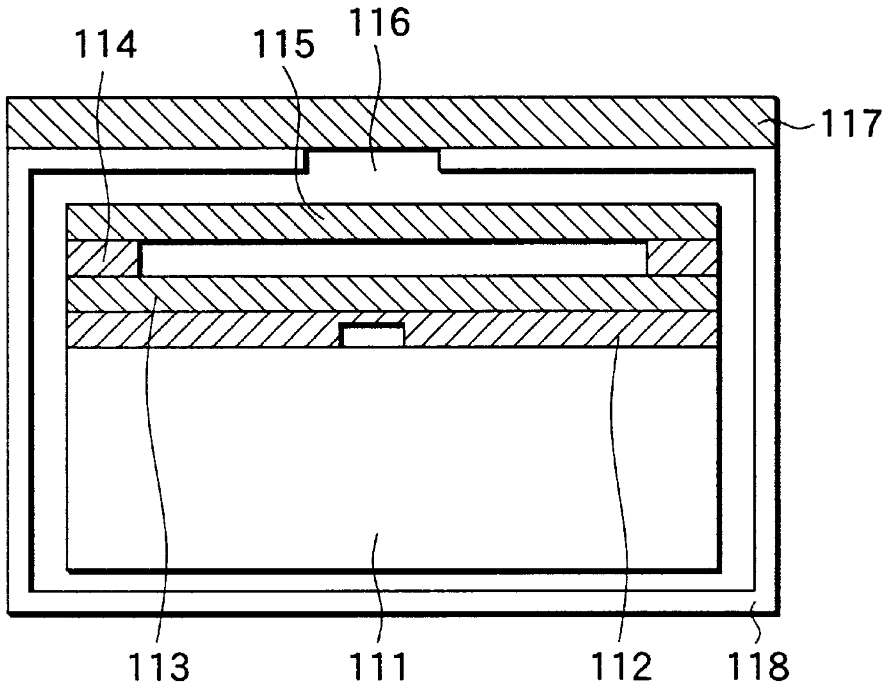
FIG. 3 is a view illustrating a structure which is obtained after a semiconductor device of the conventional art is packaged.

FIG. 2 shows the semiconductor device in the development stage. In the figure, the upper portion is a plan view, and the lower portion is a section view taken along the line A—A. Referring to FIG. 2, when the size of the stationary electrode layer 12 is increased as large as possible in order to attain a larger capacitance change, the stationary electrode layer 12 is placed in close proximity to one of the terminal pads 20 to 23 as indicated by the long-short dash line 12*a*. In the figure, the stationary electrode layer 12 is placed in close proximity to the terminal pad 21. Since a frame 15 for supporting the vibrating diaphragm 16 is disposed, the vibrating diaphragm 16 is designed so as to be larger by a dimension of the width of the frame 15. It is assumed that the vibrating diaphragm which is designed so as to be larger is a virtual vibrating diaphragm 40 indicated by the broken line. In this case, as shown in FIG. 2, the portion of the vibrating diaphragm 40 which is larger in size than the stationary electrode layer 12 overlaps with the terminal pad 21.

Therefore, there arises a problem in that, after a thin metal wire is bonded to the terminal pad 21, the thin metal wire obstructs the placement of the vibrating diaphragm 40. In order to prevent the vibrating diaphragm 40 from overlapping with the terminal pad 21, consequently, the size of the semiconductor substrate 11 must be increased so that the terminal pad 21 is placed at an outer position. The size of the semiconductor substrate 11 must be eventually increased.

By contrast, when the vibrating diaphragm 40 is shifted in the direction of the arrow in FIG. 2, the vibrating diaphragm 40 can protrude from the semiconductor substrate 11, and the terminal pad 21 can be exposed from the vibrating diaphragm 40. In other words, the configuration which has been believed in the conventional art to be realized only by increasing the size of the semiconductor substrate 11 can be realized by a size that is equal to that of the conventional art. As a result, it is possible to prevent the chip size from being increased.

Referring to FIG. 2, an empty space which is directly below a portion of the vibrating diaphragm 16, the portion is substantially vibrating and inside the frame 15, and which has a height equal to that of the spacers is defined as the space 17. The space 17 is positioned inside the semiconductor substrate 11. By contrast, as indicated by the reference numeral 100 of FIG. 1, the space 17 is positioned on or outside the side face of the semiconductor substrate 11. Namely, a part of the vibrating diaphragm 16 which actually vibrates protrudes from the semiconductor substrate 11. Then, the vibration can be directly transmitted to the vibrating diaphragm 16. Therefore, the vibrating diaphragm 16 can vibrate more easily.

Alternatively, a structure in which, as indicated by the reference numeral 101, a part of the frame 15 protrudes from the semiconductor substrate 11 may be employed. In the alternative, however, sound vibrations do not collide directly with the vibrating diaphragm which actually vibrates, and hence the degree of vibrations is slightly inferior.

Of course, one of the many terminal pads 20 to 23 may include a test pad to which probing is applied to perform measuring and testing operations. Unlike the other terminal pads, the test pad is not connected to a thin metal wire. Therefore, the vibrating diaphragm 16 may be shifted so as to overlap with the test pad.

Next, the shapes and forming positions of the stationary electrode layer 12 and the vibrating diaphragm 16 will be described. The layer and the diaphragm may be formed into a rectangular shape or a square, or a circle in the same manner as the structure of the conventional art.

In FIG. 2, all of the centers of the stationary electrode layer 12, the vibrating diaphragm 16, and the semiconductor substrate 11 coincide. In this structure, when the center of the vibrating diaphragm 16 is shifted as far as the entire region of the stationary electrode layer 12 overlaps with the vibrating diaphragm 16, the vibrating diaphragm 16 can be caused to protrude from a side edge of the semiconductor substrate 11.

FIG. 1 shows a configuration in which the center S2 of the stationary electrode layer 12 is shifted from the center S1 of the semiconductor substrate 11. According to this configuration, the vibrating diaphragm 16 can protrude from the semiconductor substrate 11. In this case, it is preferable to set the center S2 of the stationary electrode layer 12 so as to coincide with the center S3 of the vibrating diaphragm, because the center of the vibrating diaphragm 16 vibrates at the largest degree.

Referring to FIG. 1, possible structures for placing the center S1 of the semiconductor substrate 11, the center S2 of the stationary electrode layer 12, and the center S3 of the vibrating diaphragm 16 will be described in a classified manner.

(1): A structure in which the center S1 of the semiconductor substrate 11 and the center S2 of the stationary electrode layer 12 substantially coincide with each other, and the center S3 of the vibrating diaphragm 16 is shifted, so that the vibrating diaphragm 16 protrudes from the semiconductor substrate 11.

(2): A structure in which the center S1 of the semiconductor substrate 11 and the center S2 of the stationary electrode layer 12 are shifted from each other, and the center S2 of the stationary electrode layer 12 and the center S3 of the vibrating diaphragm 16 substantially coincide with each other, so that the vibrating diaphragm 16 protrudes from the semiconductor substrate 11 (see FIG. 1).

(3): A structure in which the center S1 of the semiconductor substrate 11 and the center S2 of the stationary electrode layer 12 are shifted from each other, and the center of the stationary electrode layer 12 and the center S3 of the vibrating diaphragm 16 are shifted from each other, so that the vibrating diaphragm 16 protrudes from the semiconductor substrate 11.

In the above, the term "substantially" means that the centers are allowed not to completely coincide with each other.

It is a matter of course that the shifting direction of the vibrating diaphragm is variously changed in accordance with the number and forming positions of the terminal pads.

Next, a method of producing a semiconductor electret condenser microphone will be briefly described.

The impedance converting element D and the above-mentioned integrated circuit network are formed in the semiconductor wafer by a usual semiconductor process. At this time, these elements are formed in the periphery of the stationary electrode layer 12 in order to allow the future formation of the stationary electrode layer 12.

On the semiconductor wafer, terminals of the element D and the circuit network, and the layer wirings 31, and also the plural stationary electrode layers 12 are formed on the Si oxide film 30 which is formed as a first layer.

Thereafter, an Si nitride film 32 as an insulating film and the passivation film 34 which are formed as a second layer are formed. The spacers 14 are formed on the films and around the stationary electrode layer 12 by patterning a photosensitive polyimide film.

Thereafter, the wafer is divided into individual semiconductor devices by dicing as shown in FIG. 4. Each of the semiconductor devices is mounted into a package 118, and the terminal pads 20 to 23 of the semiconductor device are connected to terminals in the package via thin metal wires.

Furthermore, the vibrating diaphragm 16 is disposed on the spacers 14. The vibrating diaphragm 16 is placed so as to protrude from the periphery of the semiconductor substrate 11, and the terminal pads 20 to 23 are formed with avoiding the placement region of the vibrating diaphragm 16, so as to be exposed. Therefore, the vibrating diaphragm 16 can be placed without being in contact with the thin metal wires.

A lid for the package 118 is placed, thereby completing the device.

Figure 5:
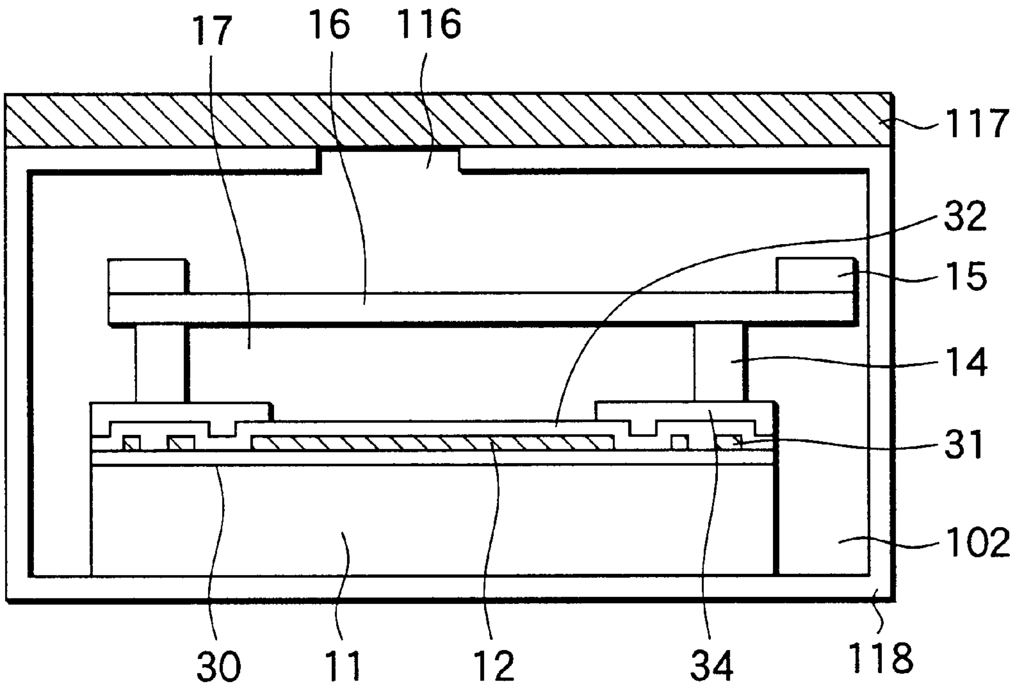
FIG. 5 is a diagram of a semiconductor electret condenser microphone which is obtained by packaging the semiconductor device of the invention.

FIG. 5 is a diagram of the semiconductor electret condenser microphone. The figure diagrammatically shows a state where the semiconductor substrate 11 on which the vibrating diaphragm 16 is disposed is packaged. Referring to FIG. 1, the spacers 14 are placed so as to be below the frame 15. The number of the spacers 14 is required to be at least two in order to support a flat face.

In the embodiment, a configuration in which the spacers 14 are placed in the entire surrounding region of the vibrating diaphragm 16, and the vibrating diaphragm 16, the semiconductor substrate 11, and the spacers define a sealed space is not employed. Instead the space 17 which is directly below the vibrating diaphragm 16 positioned inside the frame 15 communicates with a space 102 formed between the side edge of the semiconductor substrate 11 and the package 118, via gaps between the separated spacers 14.

Therefore, air in the space 17 can easily enter and exit from the space 102 via the gaps between the spacers 14, so that the vibrating diaphragm 16 can easily vibrate.

As described above, protrusion of a vibrating diaphragm from a semiconductor substrate enable the capacitance to be largely changed.

When the sizes of the stationary electrode layer and the vibrating diaphragm are increased so as to increase the capacitance, it has been required to increase the size of a semiconductor substrate in order to prevent overlapping between the vibrating diaphragm and a terminal pad which is caused by the increase of the size of vibrating diaphragm. When the vibrating diaphragm is placed so as to protrude from the semiconductor substrate and at the same time expose terminal pads, however, it is possible to prevent the size of the semiconductor substrate from being increased, with the result that a device which is light, thin, short, and small can be realized and the production cost can be prevented from being raised.

The device is designed so that the terminal pad is exposed from the vibrating diaphragm. Even when the vibrating diaphragm is disposed after a thin metal wire is connected to the terminal pad, therefore, the vibrating diaphragm can be placed without being in contact with the thin metal wire.

What is claimed is:

1. A method of producing a semiconductor electret condenser microphone comprising steps of:

forming an insulating film on a semiconductor wafer;

forming plural stationary electrode layers on said insulating film;

forming a spacer configured by an insulating resin film in a periphery of said stationary electrode layers;

forming a semiconductor device by subjected to dicing said semiconductor wafer; and disposing a vibrating diaphragm on said spacer of said semiconductor device.

2. A method of producing a semiconductor electret condenser microphone according to claim 1, wherein said vibrating diaphragm is disposed with protruding a part of said vibrating diaphragm from an end of said semiconductor device.

* * * * *

UNITED STATES PATENT AND TRADEMARK OFFICE
CERTIFICATE OF CORRECTION

PATENT NO. : 6,420,203 B1
DATED : July 16, 2002
INVENTOR(S) : Shigeaki Okawa et al.

It is certified that error appears in the above-identified patent and that said Letters Patent is hereby corrected as shown below:

Title page,
Item [73], add the following: -- Hosiden Corporation, Osaka, Japan --

Signed and Sealed this

Sixth Day of January, 2004

JAMES E. ROGAN
*Director of the United States Patent and Trademark Office*